(12) United States Patent
Sato

(10) Patent No.: US 7,959,816 B2
(45) Date of Patent: Jun. 14, 2011

(54) WET-PROCESSING APPARATUS AND METHOD OF FABRICATING DISPLAY PANEL

(75) Inventor: Takaaki Sato, Izumi (JP)

(73) Assignee: Panasonic Corporation, Osaka (JP)

( * ) Notice: Subject to any disclaimer, the term of this patent is extended or adjusted under 35 U.S.C. 154(b) by 818 days.

(21) Appl. No.: 11/916,095

(22) PCT Filed: May 26, 2006

(86) PCT No.: PCT/JP2006/310558
§ 371 (c)(1),
(2), (4) Date: Nov. 30, 2007

(87) PCT Pub. No.: WO2006/129567
PCT Pub. Date: Dec. 7, 2006

(65) Prior Publication Data
US 2010/0012620 A1    Jan. 21, 2010

(30) Foreign Application Priority Data

May 30, 2005    (JP) .................................. 2005-157182

(51) Int. Cl.
*B44C 1/22*    (2006.01)
*C23F 1/08*    (2006.01)

(52) U.S. Cl. .................. 216/13; 156/345.18; 156/345.1; 156/345.11; 156/345.15

(58) Field of Classification Search .................... 216/13; 156/345.18, 345.1, 345.11, 345.15; 210/636, 210/637, 651
See application file for complete search history.

(56) References Cited

U.S. PATENT DOCUMENTS

| 5,997,744 | A * | 12/1999 | Limaye ......................... 210/650 |
| 7,156,948 | B2 * | 1/2007 | Lin et al. .................. 156/345.18 |
| 7,267,742 | B2 * | 9/2007 | Okuchi et al. ............. 156/345.1 |
| 2006/0019480 | A1 * | 1/2006 | Cheng et al. .................. 438/612 |
| 2007/0221575 | A1 * | 9/2007 | Copeland et al. ............. 210/636 |

FOREIGN PATENT DOCUMENTS

| JP | 54-82381 | 6/1979 |
| JP | 60-34787 | 2/1985 |

(Continued)

OTHER PUBLICATIONS

Japanese Office Action 2007-518946 Mar. 26, 2010 with partial translation.

*Primary Examiner* — Nadine G Norton
*Assistant Examiner* — Mahmoud Dahimene
(74) *Attorney, Agent, or Firm* — Sughrue Mion, PLLC

(57) ABSTRACT

The wet-processing apparatus includes a wet-step bath in which a wet-step is carried out, and a vibration-type film separator for separating impurities out of a solution used in the wet-step. The wet-processing apparatus further includes a re-supply path through which the solution out of which the impurities were removed by means of the vibration-type film separator is re-supplied to the wet-step bath. Thus, it is possible to reuse a solution and a material of which a pattern is composed. Since the vibration-type film separator is used, it is possible to reduce a frequency of exchanging filters equipped in the vibration-type film separator, and ensure a high rate at which a material of which a pattern is composed is recovered, regardless of a specific gravity of the material.

13 Claims, 16 Drawing Sheets

FOREIGN PATENT DOCUMENTS

| | | |
|---|---|---|
| JP | 10-242047 A | 9/1998 |
| JP | 11-228950 A | 8/1999 |
| JP | 11-262765 | 9/1999 |
| JP | 11-262765 A | 9/1999 |
| JP | 2000-56472 A | 2/2000 |
| JP | 3191772 * | 7/2001 |
| JP | 2003-109897 A | 4/2003 |
| WO | 2005/040930 A1 | 5/2005 |

* cited by examiner

WET-PROCESSING APPARATUS AND METHOD OF FABRICATING DISPLAY PANEL

BACKGROUND OF THE INVENTION

1. Field of the Invention

The invention relates to a wet-processing apparatus and a method of fabricating a display panel.

2. Description of the Related Art

A process of fabricating a display panel such as a plasma display panel (hereinafter, referred to as "PDP") includes a step of forming various patterns on a substrate, such as an patterns of an electrode, a rib, a fluorophor layer, a black matrix, a black stripe, and a color filter.

For instance, a wet step in which a processing solution such as developing agent is used is usually applied to a step of forming patterns on a substrate.

Specifically, for instance, photosensitive material (photoresist) is coated in a pre-step all over a substrate by printing, seating or coating. Then, the sensitive material is exposed to light in a predetermined pattern. Then, the substrate is soaked into developing agent in a wet-processing bath, or developing agent is sprayed onto the substrate, to thereby remove a portion of the sensitive material which was not exposed to light (or exposed to light). Thus, the sensitive material is patterned on the substrate.

Consequently, a processing solution such as developing agent having been used for a wet step contains a material of which a pattern formed on a substrate is composed.

A used processing solution is usually used for a wet-step a plurality of times.

Since a material of which a pattern is composed (hereinafter, referred to as "pattern material") is often expensive (for instance, Ag (silver) used for fabricating an electrode), it is preferable to separate and recover such pattern material out of a used processing solution for recycling.

For instance, the patent reference 1 suggests a process of separating and recovering pattern material out of a used processing solution by means of a filter, and recycling the processing solution out of which the pattern material was separated, to a wet step again (hereinafter, this process is referred to as "filter process").

The patent reference 2 suggests a method of recycling phosphor contained in developing agent, including a step of (a) recovering the phosphor by still standing the developing agent to precipitate the phosphor, (b) recovering the phosphor by filtrating the developing agent, or (c) recovering the phosphor through the use of a centrifugal separator.

The patent reference 3 suggests a process of separating and recovering pattern material out of developing agent through the use of a decanter type centrifugal separator (hereinafter, this process is referred to as "centrifugal separator process").

Patent reference 1: Japanese Patent Application Publication No. 10-242047

Patent reference 2: Japanese Patent Application Publication No. 11-228950

Patent reference 3: Japanese Patent No. 319772

The filter process suggested in the patent reference 1 is accompanied with a problem of high frequency of exchanging a filter. Furthermore, each time a filter is exchanged, it may be necessary to temporarily stop a production line. Accordingly, the filter process is not suitable to fabrication of a lot of large-sized substrates.

The process of recovering phosphor by filtrating developing agent, suggested in the patent reference 2, is accompanied with a problem identical with the above-mentioned problem.

Furthermore, the process of still standing developing agent to precipitate phosphor, suggested in the patent reference 2, is accompanied with a problem that it takes much time to separate and recover phosphor out of developing agent.

The centrifugal separator process as suggested in the patent references 2 and 3 is accompanied with a problem that a recover rate is relatively high in the case that pattern material contained in a solution has a high specific weight, whereas if the solution had a low specific weight, a recover rate would be lowered.

Specifically, for instance, in the case of fabricating a silver electrode having a high specific weight among materials to be used in a step of carrying out a wet step to form a pattern for PDP, there could be obtained a recover rate of 90% or greater. In contrast, in a process in which pigment material having a relatively low specific weight is used (for instance, a step of fabricating a black matrix), a recovery rate would be extremely lowered, specifically, lowered down to about 20%. Thus, the centrifugal separator process is accompanied with a problem that a recovery rate is much changed in dependence on a specific weight of pattern material (that is, impurities to be recovered out of developing agent).

In addition, when recycled developing agent out of which pattern material has been already separated is reused, if the recycled developing agent contains much impurities, there would be caused a problem, because of a low recovery rate of pattern material, that development quality is harmfully influenced, and thus, it would be impossible to stably form a pattern.

Furthermore, when recycled developing agent out of which pattern material has been already separated is reused, if the recycled developing agent contains much impurities, there would be caused a problem that conduits in which developing agent is circulated is clogged, and a nozzle through which developing agent is sprayed is clogged.

As a result, it is necessary in the centrifugal separator process to frequently exchange developing agent into new one in order to make it possible to stably form a pattern, and to avoid a path through which recycled developing agent is circulated, such as conduits and a nozzle, from being clogged.

SUMMARY OF THE INVENTION

The above-mentioned problems found in the patent references 1 to 3 are an exemplary problem to be solved by the present invention.

A wet-processing apparatus for carrying out a wet-step to form a pattern on a substrate defining a display panel, in accordance with the present invention, includes a wet-step bath in which the wet-step is carried out, a vibration-type film separator for separating impurities out of a solution used in the wet-step, a re-supply path through which the solution out of which the impurities were removed by means of the vibration-type film separator is re-supplied to the wet-step bath, a tank in which a solution having been used for the wet-step and supplied from the wet-step bath is temporarily stored, a pump for feeding the solution stored in the tank into the vibration-type film separator, and a path through which an enriched solution containing impurities separated from the solution by means of the vibration-type film separator is fed into the tank from the vibration-type film separator.

A method of fabricating a display panel including a wet-step to form a pattern on a substrate defining a display panel, in accordance with the present invention, includes a separation step of separating impurities out of a solution having been used in the wet-step carried out in a wet-step bath, the separation step being carried out by means of a vibration-type film separator, re-supplying a solution out of which the impurities were removed in the separation step, into the wet-step bath, storing an enriched solution containing the impurities separated out of the solution by means of the vibration-type film separator, into a tank selected among a plurality of tanks which are capable of storing the enriched solution, detecting a concentration of impurities contained in the enriched solution stored in the selected tank, and switching the selected tank into another tank, when the concentration of impurities contained in the enriched solution stored in the selected tank is over a threshold.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
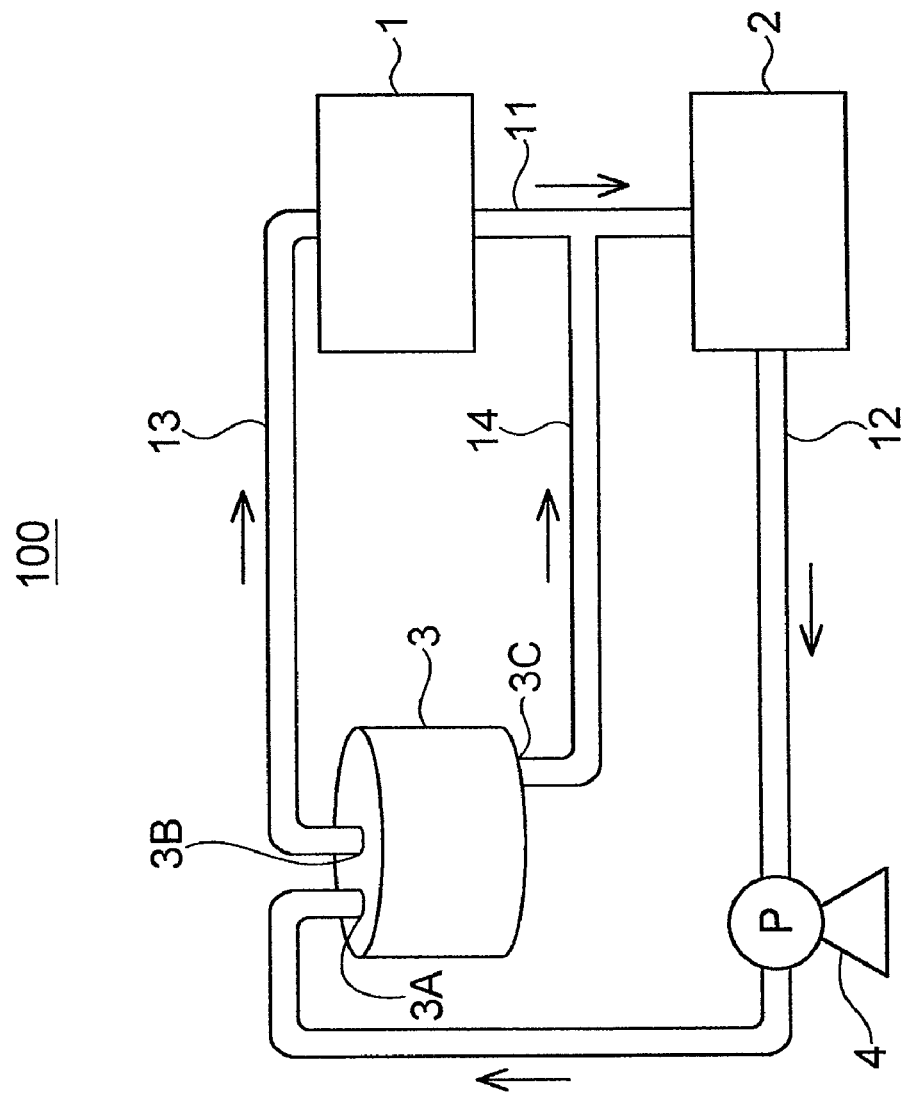
FIG. 1 is a schematic view illustrating a structure of a wet-processing apparatus in accordance with the first embodiment of the present invention.

Hereinbelow are explained an embodiment in accordance with the present invention.

A wet-processing apparatus in accordance with the embodiment is used in a wet-step to form a pattern on a substrate defining a display panel.

The wet-processing apparatus in accordance with the embodiment includes a wet-step bath in which the wet-step is carried out, a vibration-type film separator for separating impurities out of a solution used in the wet-step, a re-supply path through which the solution out of which the impurities were removed by means of the vibration-type film separator is re-supplied to the wet-step bath, a tank in which a solution having been used for the wet-step and supplied from the wet-step bath is temporarily stored, a pump for feeding the solution stored in the tank into the vibration-type film separator, and a path through which an enriched solution containing impurities separated from the solution by means of the vibration-type film separator is fed into the tank from the vibration-type film separator.

It is preferable that the wet-processing apparatus includes a plurality of the tanks, wherein the solution and the enriched solution are supplied from the wet-step bath and the vibration-type film separator, respectively, selectively to any one of the tanks, the apparatus further comprising a flow-path switching unit for supplying a solution stored in the selected tank into the vibration-type film separator.

It is preferable the wet-processing apparatus further includes a concentration-detecting sensor for detecting a concentration of impurities contained in the solution stored in each of the tanks, and a controller which, when the concentration of impurities contained in a solution stored in the selected tank is over a threshold, controls the flow-path switching unit to switch the selected tank into another tank.

It is preferable that the wet-processing apparatus in accordance with the embodiment further includes a centrifugal separator which separates impurities out of a solution used for the wet-step carried out in the wet-step bath, in which case, the vibration-type film separator further separates impurities out of the solution out of which impurities have been already separated by the centrifugal separator.

It is preferable that the wet-processing apparatus further includes a first tank temporarily storing therein a solution having been used for the wet-step, supplied from the wet-step bath, a first pump for feeding the solution stored in the first tank, into the centrifugal separator, a second tank temporarily storing a solution out of which the impurities have been separated by the centrifugal separator, and a second pump for feeding the solution stored in the second tank, into the vibration-type film separator.

It is preferable that the wet-processing apparatus in accordance with the embodiment further includes a path through which a enriched solution containing impurities having been separated out of a solution by the vibration-type film separator is fed into the first tank from the vibration-type film separator.

It is preferable that the wet-processing apparatus in accordance with the embodiment further includes a second tank temporarily storing a enriched solution containing impurities having been separated out of a solution by the vibration-type film separator, and a second vibration-type film separator which further separates impurities out of the enriched solution supplied from the second tank.

It is preferable that the wet-processing apparatus in accordance with the embodiment further includes a path through which an enriched solution containing impurities separated from the solution by means of the second vibration-type film separator is fed into the second tank from the second vibration-type film separator.

It is preferable that the wet-processing apparatus in accordance with the embodiment further includes a re-supply path through which a solution separated out of the enriched solution by means of the second vibration-type film separator is re-supplied to the wet-step bath from the second vibration-type film separator.

At least one of the vibration-type film separator and the second vibration-type film separator may be comprised of a plurality of filters vertically arranged such that each of the filters is spaced away by a predetermined gap from adjacent ones, a filter container in which the filters are accumulated, and a vibrator for vibrating both the filters and the filter container, wherein each of the filters is comprised of a metal plate, a film which allows the solution to pass therethrough, but does not allow the impurities to pass therethrough, and a drain cloth sandwiched between the metal plate and the film, and allowing the solution to pass therethrough, each of the filters is in the form of a flat plate, and is formed with a first opening and a second opening, a seal is formed along and between edges of the second openings of filters disposed vertically adjacent to each other, and the first openings of the filters vertically adjacent to each other are arranged in non-alignment with each other.

At least one of the vibration-type film separator and the second vibration-type film separator may be comprised of a plurality of filters vertically arranged such that each of the filters is spaced away by a predetermined gap from adjacent ones, a filter container in which the filters are accumulated, and a vibrator for vibrating both the filters and the filter container, wherein each of the filters is comprised of a metal plate, a film which allows the solution to pass therethrough, but does not allow the impurities to pass therethrough, and a drain cloth sandwiched between the metal plate and the film, and allowing the solution to pass therethrough, each of the filters is in the form of a reversed cone, and is formed with a first opening and a second opening, and a seal is formed along and between edges of the second openings of filters disposed vertically adjacent to each other.

At least one of the vibration-type film separator and the second vibration-type film separator may be comprised of a plurality of filters vertically arranged such that each of the filters is spaced away by a predetermined gap from adjacent ones, a filter container in which the filters are accumulated, and a vibrator for vibrating both the filters and the filter container, wherein each of the filters is comprised of a metal plate, a film which allows the solution to pass therethrough, but does not allow the impurities to pass therethrough, and a drain cloth sandwiched between the metal plate and the film, and allowing the solution to pass therethrough, each of the filters is in the form of a flat plate, and is formed with a first opening, a seal is formed along and between outer edges of filters disposed vertically adjacent to each other, and the first openings of the filters vertically adjacent to each other are arranged in non-alignment with each other.

At least one of the vibration-type film separator and the second vibration-type film separator may be comprised of a plurality of filters vertically arranged such that each of the filters is spaced away by a predetermined gap from adjacent ones, a filter container in which the filters are accumulated, and a rotation unit for rotating the filters, wherein each of the filters is comprised of a metal plate, a film which allows the solution to pass therethrough, but does not allow the impurities to pass therethrough, and a drain cloth sandwiched between the metal plate and the film, and allowing the solution to pass therethrough, each of the filters is in the form of a reversed cone, and is formed with a first opening, a seal is formed along and between outer edges of filters disposed vertically adjacent to each other, the first openings of the filters vertically adjacent to each other are arranged in non-alignment with each other, and the rotation unit rotates the filters around central axes of the filters.

A method of fabricating a display panel in accordance with the embodiment includes a wet-step to form a pattern on a substrate defining a display panel.

The method of fabricating a display panel in accordance with the embodiment includes a separation step of separating impurities out of a solution having been used in the wet-step carried out in a wet-step bath, the separation step being carried out by means of a vibration-type film separator, re-supplying a solution out of which the impurities were removed in the separation step, into the wet-step bath, storing an enriched solution containing the impurities separated out of the solution by means of the vibration-type film separator, into a tank selected among a plurality of tanks which are capable of storing the enriched solution, detecting a concentration of impurities contained in the enriched solution stored in the selected tank, and switching the selected tank into another tank, when the concentration of impurities contained in the enriched solution stored in the selected tank is over a threshold.

The step of forming the pattern, included in the method of fabricating a display panel in accordance with the embodiment, is comprised of, for instance, a step of forming an electrode (for instance, a step of forming an Ag (silver) electrode), a step of forming a rib, a step of forming a fluorophor layer, a step of forming a black matrix, a step of forming a black stripe, or a step of forming a color filter.

A method of fabricating a display panel including a wet-step to form a pattern on a substrate defining a display panel, in accordance with the embodiment, includes a separation step of separating impurities out of a solution having been used in the wet-step carried out in a wet-step bath, the separation step being carried out by means of a vibration-type film separator, re-supplying a solution out of which the impurities were removed in the separation step, into the wet-step bath, and carrying out a step of separating impurities out of a solution having been used for the wet-step, by means of a centrifugal separator, prior to the separation step.

In the above-mentioned embodiment in accordance with the present invention, the vibration type film separator separates impurities out of a solution having been used for a wet-step carried out in a wet-step bath. The solution out of which impurities were separated by means of the vibration type film separator is re-supplied into the wet-step bath, and hence, can be reused.

Furthermore, since impurities are separated out of a solution by means of a vibration type film separator, it is possible to reduce a frequency at which a filter of the vibration type film separator is exchanged, because the filter is hardly clogged. Accordingly, it is possible to reduce a frequency at which a fabrication line for fabricating a display panel has to be stopped, ensuring that a vibration type film separator can be used in a step for processing a lot of large-sized substrates.

In addition, since separation of impurities out of a solution is carried out by means of a vibration type film separator, it is possible to continuously carry out the separation, ensuring that it does not take much time for separation and recovery of impurities.

Furthermore, since separation of impurities out of a solution is carried out by means of a vibration type film separator, a recovery rate at which impurities are recovered is dependent only on a diameter of a fluid-permeable film of the vibration type film separator. Specifically, a recover rate is not fluctuated by a specific weight of impurities, ensuring that impurities can be separated out regardless of a specific weight of impurities.

Accordingly, it is possible to precisely fabricate a pattern. Furthermore, a conduit through which a solution is circulated is hard to be clogged, ensuring that if a solution was sprayed through a nozzle, the nozzle would be hardly clogged.

Exemplary Embodiment 1

FIG. 1 is a schematic view illustrating a structure of a circulation type wet-processing apparatus 100 in accordance with the first exemplary embodiment of the present invention.

As illustrated in FIG. 1, the circulation type wet-processing apparatus 100 in accordance with the first exemplary embodiment is designed to include a wet-step bath 1 in which a wet-step is carried out for forming a pattern on a substrate defining PDP, a fluid tank 2 in which a developing agent having been used for the wet step carried out in the wet-step bath 1 is temporarily stored, a vibration-type film separator 3 for separating impurities out of the developing agent fed from the fluid tank 2, and a circulation pump 4 for feeding the developing agent stored in the fluid tank 2 into the vibration-type film separator 3.

In the wet-step bath 1, a wet step is carried out through the use of a developing agent to form a predetermined pattern on a substrate.

For instance, a pattern to be formed on a substrate in the wet-step batch 1 includes an electrode (for instance, an Ag (silver) electrode), a rib, a fluorophor layer, a black matrix, a black stripe, and a color filter.

In a pre-step to be carried out prior to the step of forming a pattern in the wet-step bath 1, sensitive material coated all over a substrate by printing, seating or coating is exposed to light for patterning.

Then, the substrate is immersed into a developing agent in the wet-step bath 1, or a developing agent is sprayed onto sensitive material coated on the substrate, to thereby remove a portion of the sensitive material having been not exposed to light (in the case that the sensitive material is negative type material). If the sensitive material is positive type material, a portion of the sensitive material having been exposed to light is removed.

Thus, a desired pattern is formed on the substrate.

The wet-step bath 1 and the fluid tank 2 make fluid communication with each other through a conduit 11. A developing agent having been used for a wet step in the wet-step bath 1, that is, a used developing agent containing sensitive material as impurities is fed into the fluid tank 2 through the conduit 11.

The fluid tank 2 is connected to an inlet 3A of the vibration type film separator 3 through a conduit 12.

A developing agent stored in the fluid tank 2 is pressurized by the circulation pump 4 arranged in the conduit 12, and is introduced into the inlet 3A of the vibration type film separator 3 through the conduit 12.

A developing agent introduced into the vibration type film separator 3 is separated into pure developing agent and concentrated developing agent containing impurities (residues) in the vibration type film separator 3 (detailed later).

The filtrated and thus pure developing agent is exhausted out of the vibration type film separator 3 through a first outlet 3B of the vibration type film separator 3.

The first outlet 3B makes fluid communication with the wet-step bath 1 through a conduit (a re-supply path) 13.

The pure developing agent exhausted through the first outlet 3B is introduced into the wet-step bath 1 through a conduit 13, and will be reused for a wet step to be carried out in the wet-step bath 1.

The concentrated developing agent containing impurities, separated out of the used developing agent in the vibration type film separator 3, is exhausted out of the vibration type film separator 3 through a second outlet 3C of the vibration type film separator 3.

The second outlet 3C makes fluid communication with the conduit 11 through a conduit 14.

The concentrated developing agent having been exhausted through the second outlet 3C is introduced into the fluid tank 2 through the conduits 14 and 11, and then, is introduced again into the inlet 3A of the vibration type film separator 3 through the conduit 12 by means of the circulation pump 4. In the same way as mentioned above, the concentrated developing agent is filtrated by the vibration type film separator 3. Specifically, the developing agent is separated into pure developing agent and concentrated developing agent containing impurities (residues).

Figure 2:
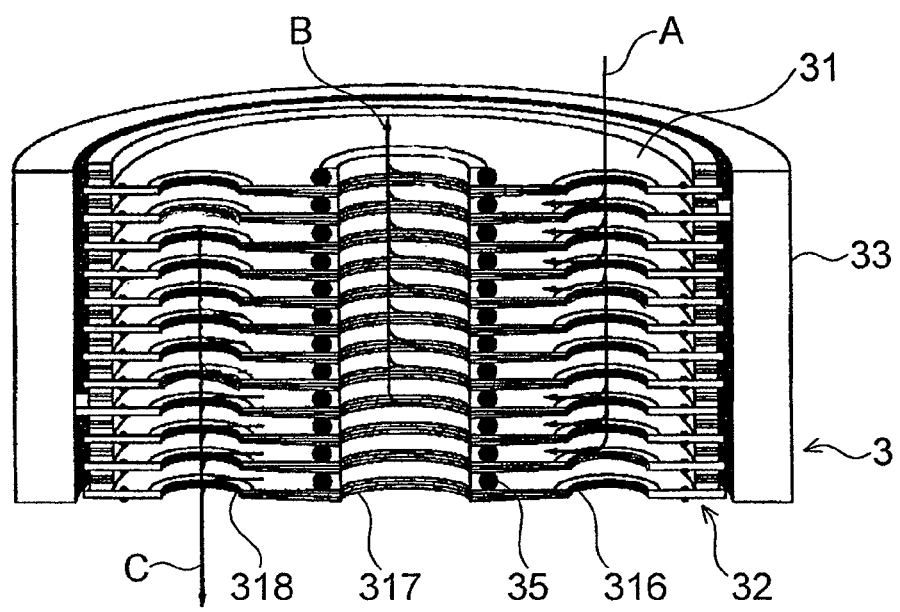
FIG. 2 is a perspective cross-sectional view illustrating a gist of a vibration type film separator defining a part of the wet-processing apparatus in accordance with the first embodiment of the present invention.

FIG. 2 is a perspective cross-sectional view illustrating a gist of the vibration type film separator 3.

As illustrated in FIG. 2, the vibration type film separator 3 includes a filter unit 32 including a plurality of filters 31 vertically arranged such that each of the filters is spaced away by a predetermined gap from adjacent ones, a filter container 33 in which the filter unit 32 is accumulated, and a vibrator (not illustrated) for vibrating the filter unit 32 together with the filter container 33.

Figure 3:
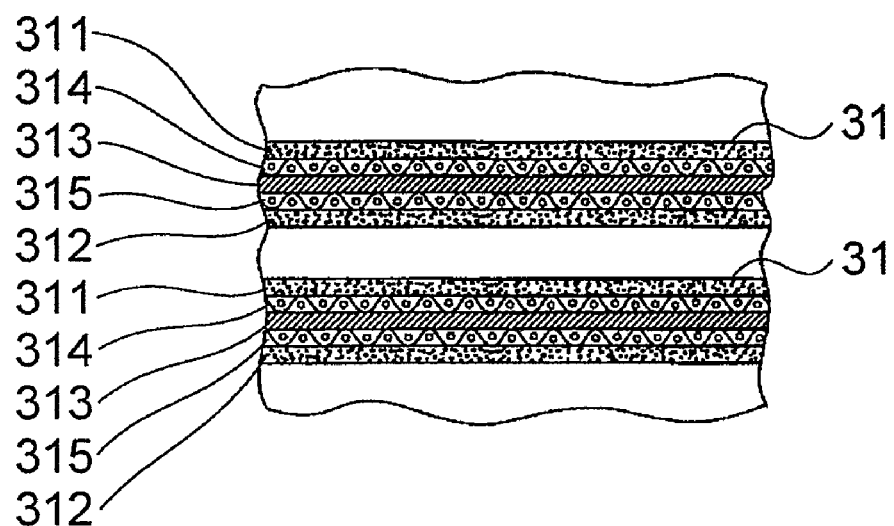
FIG. 3 is a cross-sectional view illustrating a layered-structure of a filter of the vibration type film separator illustrated in FIG. 2.

FIG. 3 is a cross-sectional view illustrating a layer-structure of the filters 31.

As illustrated in FIG. 3, each of the filters 31 is comprised of, for instance, an upper fluid-permeable film 311, a lower fluid-permeable film 312, a metal plate 313 arranged between the fluid-permeable films 311 and 312, and drain cloths 314 and 315 sandwiched between the metal plate 313, and the fluid-permeable films 311 and 312. For instance, the drain cloths 314 and 315 are composed of non-woven web.

Each of the filters 31 may be comprised of a metal plate 313, and a fluid-permeable film and a drain cloth arranged on an either side of the metal plate 313. For instance, each of the filters 31 may be comprised of a metal plate 313, a fluid-permeable film 311, and a drain cloth 314 sandwiched between the metal plate 313 and the fluid-permeable film 311.

Figure 4:
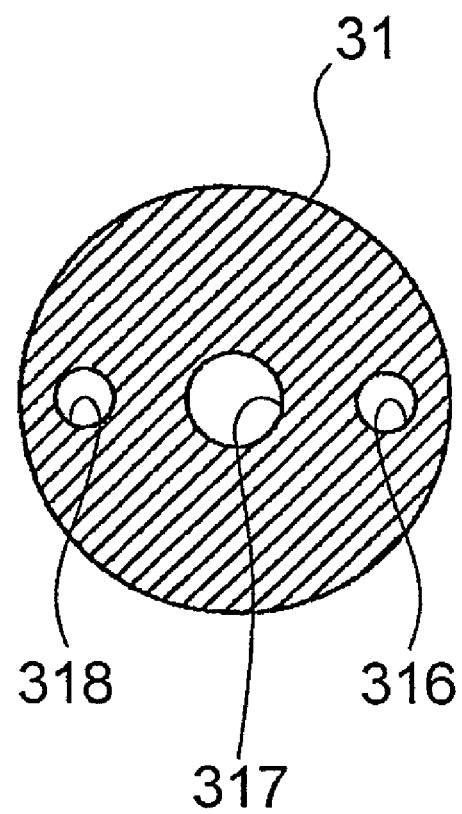
FIG. 4 is a plan view of a filter of the vibration type film separator illustrated in FIG. 2.

FIG. 4 is a plan view of each of the filters 31.

As illustrated in FIGS. 2 and 4, each of the filters 31 is in the form of a circular plate, for instance.

As illustrated in FIG. 4, each of the filters 31 is formed with three openings, specifically, a first opening 316, a second opening 317, and a third opening 318 all passing through the filter 31 in a thickness-wise direction. The second opening 317 is disposed at the center of each of the filters 31, and the first and third openings 316 and 318 are disposed on a diameter passing through the center of the filter 31 symmetrically about the first opening 317.

As illustrated in FIG. 2, an O-ring 35 is sandwiched between adjacent filters 31 as a sealing material along an edge of the second opening 317. The O-ring 315 seals a space formed between the vertically adjacent filters 31 from the second opening 317.

The first opening 316 in each of the filters 31 allows a used developing agent having been introduced into the filter unit 32 through the inlet 3A of the vibration type film separator 3, to pass along a path A shown in FIG. 2.

Figure 5:
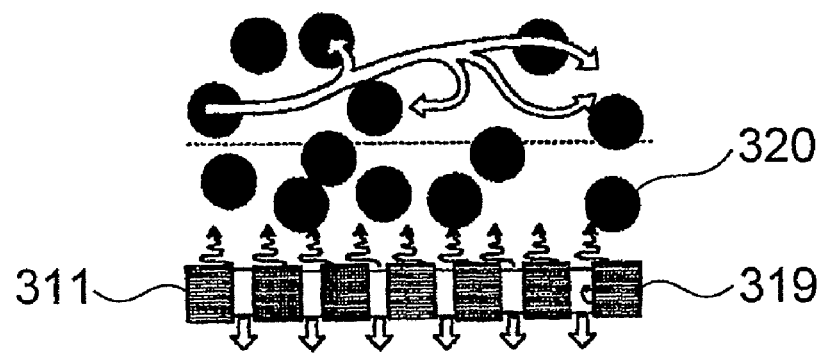
FIG. 5 is a schematic view for explaining an operation of the vibration type film separator illustrated in FIG. 2.

FIG. 5 is a schematic cross-sectional view to explain how a developing agent is filtrated by means of the fluid-permeable films 311 and 312.

As illustrated in FIG. 5, the fluid-permeable film 311 in each of the filters 31 is formed with a lot of minute apertures 319 passing through the fluid-permeable film 311 in a thickness-wise direction. Though not illustrated, the fluid-permeable film 312 in each of the filters 31 is formed with a lot of minute apertures 319 similarly to the fluid-permeable film 311.

The apertures 319 of the fluid-permeable films 311 and 312 are designed to have such a dimension that impurities 320 contained in a used developing agent are not allowed to pass therethrough, but only a clean part of a developing agent is allowed to pass therethrough.

It is preferable that the apertures 319 have a diameter (fluid-permeable diameter) of 0.5 micrometers or smaller, taking a processing efficiency and a recovery rate into consideration, for instance. It is more preferable that the apertures 319 have a diameter in the range of 0.2 to 0.5 micrometers both inclusive.

A dimension of the apertures 319 is selected in accordance with diameters (molecular weight) of a component to be reused (that is, a component to pass through the apertures 319) and a component to be removed (that is, a component not to pass through the apertures 319).

Since a used developing agent is introduced into the vibration type film separator 3 by being fed by the circulation pump 4 in the above-mentioned manner, a developing agent component contained in the used developing agent passes through the fluid-permeable films 311 and 312 of each of the filters 31, and penetrates the drain cloths 314 and 315 from outside of the filters 31.

A clean developing agent filtrated by the fluid-permeable films 311 and 312 in each of the filters 31, and penetrating the drain cloths 314 and 315 moves in the drain cloths 314 and 315, and goes out inside of the second opening 317.

The second opening 317 in each of the filters 31 allows a clean developing agent leaving the drain cloths 314 and 315 in each of the filters 31 to pass along a path B shown in FIG. 2 to thereby introduce the clean developing agent to the first outlet 3B of the vibration type film separator 3.

Since the impurities 320 which could not pass through the fluid-permeable films 311 and 312 in each of the filters 31, and hence, could not penetrate the drain cloths 314 and 315 are blocked by the O-ring 35, and hence, are not able to flow into the second opening 317. Accordingly, the impurities 320 run along the second opening 317 in each of the filters 31 towards the third opening 318, and pass through the second openings 317 of the filters 31 along a path C shown in FIG. 2. Thus, the impurities 320 are introduced to the second outlet 3C of the vibration type film separator 3.

It should be noted that the vibration type film separator 3 are inversely illustrated in FIGS. 1 and 2 with respect to left-right position.

The vibrator of the vibration type film separator 3 is comprised of a motor and an eccentric vibration unit, for instance, to continuously apply vibration to the filter unit 32. Specifically, the vibrator applies vibration to the filter unit 32, for instance, at an amplitude of 1 to 2.5 cm and at a vibration frequency of 40 to 60 Hz such that the filters 31 are rotated in planes in which the filters 31 lie, or the vibrator applies vibration to the filter unit 32 by causing the filters 31 to do linear reciprocating movement in planes in which the filters 31 lie.

Since the above-mentioned vibration is applied to the filter unit 32, impurity particles 320 (see FIG. 5) are caused to move far away from the fluid-permeable films 311 and 312 due to sharing force generated by the vibration in the vicinity of surfaces of the fluid-permeable films 311 and 312 in each of the filters 31. Thus, concentration polarization (generation of a region in which a concentration is extremely high) is suppressed to be generated in the filter unit 32, ensuring that the impurity particles 320 are suppressed from being adhered to the fluid-permeable films 311 and 312.

The impurity particles 320 can be easily peeled off the fluid-permeable films 311 and 312 due to the sharing force.

Thus, it is possible to prevent the fluid-permeable films 311 and 312 (the filters 31) from being clogged, ensuring that the fluid-permeable films 311 and 312 can be kept clean at surfaces thereof.

Accordingly, it is possible to decrease reduction in flux of a developing agent passing through the fluid-permeable films 311 and 312, and hence, to maintain flux stably high for a long time.

Thus, it is possible to reduce a frequency at which the filters 31 (the filter unit 32) are exchanged to new ones, and condense the condensed developing agent contained in the tank 2, even if the filters 31 (the filter unit 32) were not exchanged to new ones.

When a concentration of the condensed developing agent contained in the tank 2 becomes too high, an operation of the circulation type wet-processing apparatus 100 is stopped, and then, solid components (that is, solidified impurities) contained in the tank 2 are recovered.

Furthermore, it is possible to fabricate PDP after forming a pattern on a substrate by a wet step to be carried out through the use of the circulation type wet-processing apparatus 100.

The circulation type wet-processing apparatus 100 in accordance with the first exemplary embodiment of the present invention includes a wet-step bath 1 in which a wet-step is carried out, a vibration-type film separator 3 for separating impurities out of a developing agent used for the wet step, and a conduit 13 acting as a re-supply path through which a developing agent out of which impurities are separated by means of the vibration-type film separator 3 is supplied to the wet-step bath 1. The vibration-type film separator 3 separates impurities out of a developing agent used for a wet step carried out in the wet-step bath 1, and the developing agent out of which impurities are separated by means of the vibration-type film separator 3 is re-supplied to the wet-step bath 1. Thus, it is possible to reuse a developing agent.

The impurities separated and recovered out of a developing agent can be reused as pattern material.

Furthermore, separation of impurities out of a developing agent is carried out by the vibration-type film separator 3. Since the filters 31 equipped in the vibration-type film separator 3 are seldom clogged, it is possible to lower a frequency at which the filters 31 (the filter unit 32) are exchanged to new ones. This ensures that it is possible to lower a frequency at which a line for fabricating PDP is stopped, and hence, it is possible to use the line for processing a lot of large-sized substrates.

Furthermore, since separation of impurities out of a developing agent is carried out by the vibration-type film separator 3, it is possible to continuously carry out the separation. This ensures that it does not take much time for separation and recovery of impurities.

Furthermore, since separation of impurities out of a developing agent is carried out by the vibration-type film separator 3, it is possible to remove impurities having a small diameter which were not able to be removed by a conventional filter. Accordingly, it is possible that the conduits 11, 12 and 14 are hard to be clogged.

Furthermore, since separation of impurities out of a developing agent is carried out by the vibration-type film separator 3, a recovery rate of impurities is dependent only on a diameter of particles which are able to pass through the fluid-permeable films 311 and 312 of the vibration type film separator 3. That is, there is no dispersion in a recovery rate in dependence on a specific weight of the impurities 320, and accordingly, it is possible to smoothly separate the impurities 320 regardless of a specific weight of the impurities 320.

For instance, the experiment having been conducted for various pattern materials in which a diameter of a particle which is able to pass through the fluid-permeable films 311 and 312 was set equal to 0.4 micrometers shows that a recovery rate of 90% or greater (almost 100%) could be accomplished regardless of pattern material.

Accordingly, it is possible to keep a volume of impurities contained in a recycled developing agent extremely low, and enhance development quality presented by a wet step in which the recycled developing agent is used, ensuring that a pattern can be stably formed. In addition, it is possible to reduce a frequency at which a developing agent is exchanged to new one, ensuring reduction in a volume of a developing agent to be used.

Since separation of impurities can be preferably carried out regardless of a specific weight of impurities as mentioned above, it is possible to avoid the conduits 11, 12 and 14 in which a developing agent is circulated from being clogged, or avoid a nozzle (not illustrated) from being clogged in the case that a nozzle is used for spraying a developing agent in the wet-step bath 1.

Exemplary Embodiment 2

The circulation type wet-processing apparatus in accordance with the second exemplary embodiment of the present invention is designed to additionally include a centrifugal separator in comparison with the circulation type wet-processing apparatus 100 in accordance with the above-mentioned first exemplary embodiment.

Figure 6:
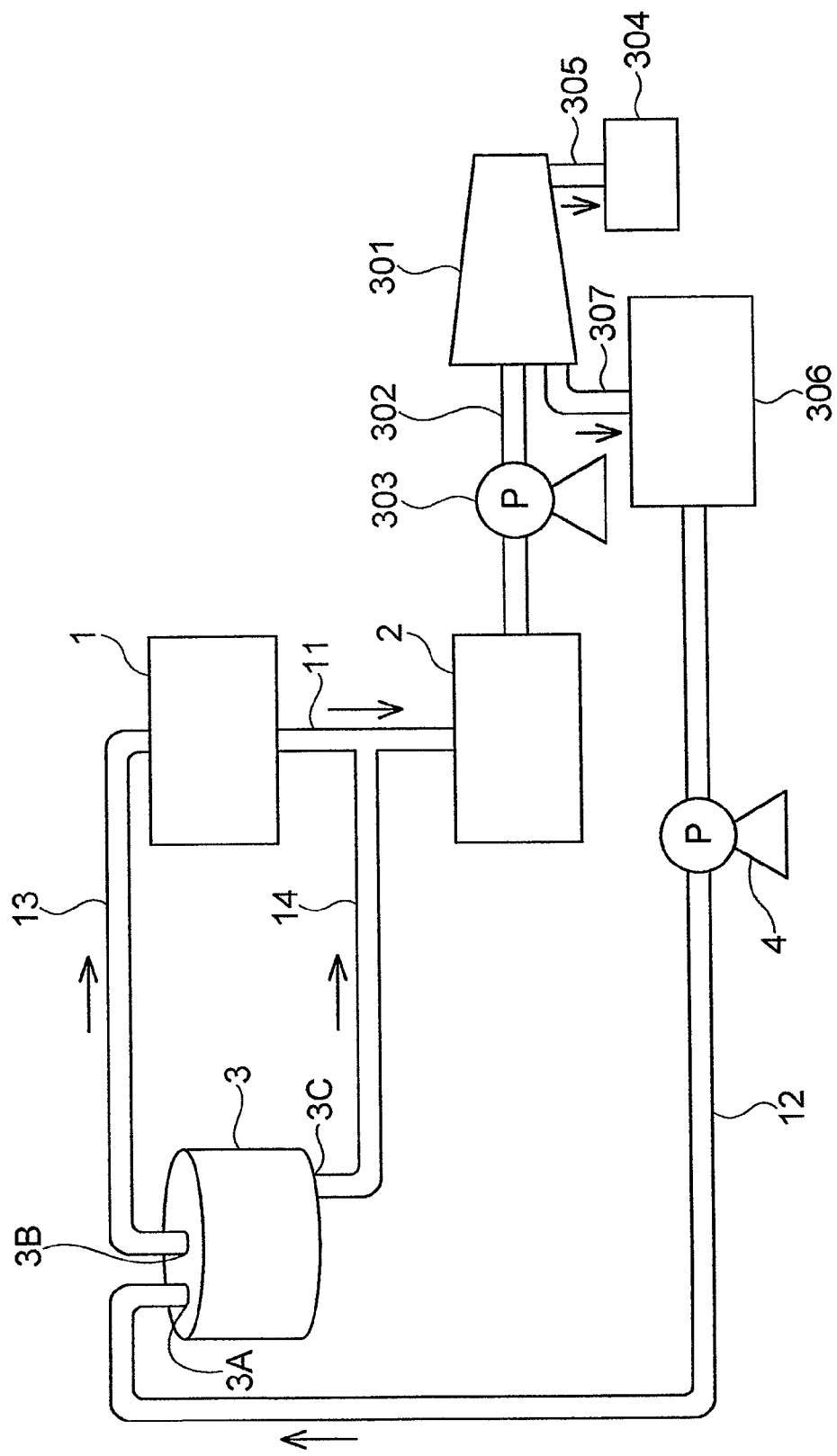
FIG. 6 is a schematic view illustrating a structure of a wet-processing apparatus in accordance with the second embodiment of the present invention.

FIG. 6 is a schematic view illustrating a structure of the circulation type wet-processing apparatus 200 in accordance with the second exemplary embodiment.

The circulation type wet-processing apparatus 200 in accordance with the second exemplary embodiment is structurally different from the circulation type wet-processing apparatus 100 in accordance with the above-mentioned first exemplary embodiment only in the following, and has the same structure as that of the circulation type wet-processing apparatus 100 in accordance with the above-mentioned first exemplary embodiment except the following. Accordingly, parts of the circulation type wet-processing apparatus 200 in accordance with the second exemplary embodiment corresponding to those of the circulation type wet-processing apparatus 100 in accordance with the above-mentioned first exemplary embodiment have been provided with the same reference numerals, and are not explained.

As illustrated in FIG. 6, the circulation type wet-processing apparatus 200 in accordance with the second exemplary embodiment is designed to additionally include, in comparison with the parts of the circulation type wet-processing apparatus 100 in accordance with the above-mentioned first exemplary embodiment, a centrifugal separator 301 which continuously separates impurities out of a used developing agent, a conduit 302 through which a developing agent contained in the fluid tank 2 is fed into the centrifugal separator 301, a pump 303 disposed in the conduit 302 for feeding a developing agent contained in the fluid tank 2 into the centrifugal separator 301, a solid recovery tank 304 in which impurities (solid) separated out of a used developing agent by means of the centrifugal separator 304 are stored, a conduit 305 through which solid separated out of a used developing agent by means of the centrifugal separator 301 is fed into the solid recovery tank 304 from the centrifugal separator 301, a fluid tank 306 in which a developing agent out of which impurities (solid) are removed by means of the centrifugal separator 301 is used, and a conduit 307 through which a developing agent out of which impurities were removed by means of the centrifugal separator 301 are fed into the fluid tank 306 from the centrifugal separator 301.

The fluid tank 2 stores therein a mixture solution of a used developing agent having been used for a wet step carried out in the wet-step bath 1, and a condensed developing agent exhausted from the second outlet 3C of the vibration type film separator 3.

The mixture solution is fed to the centrifugal separator 301 from the fluid tank 2 by means of the pump 303.

The centrifugal separator 301 centrifugalizes solids out of the mixture solution fed from the fluid tank 2.

Though it depends on a specific weight of the solids, it is possible to continuously separate solids by about 30 to about 98%, for instance.

The thus separated solids have a water content of 10% or smaller. The solids are fed to the solid recovery tank 304 through the conduit 305.

A developing agent out of which the solids are removed is fed into the fluid tank 306 through the conduit 307.

In the exemplary embodiment 2, the conduit 12 connects the fluid tank 306 to the outlet 3A of the vibration type film separator 3, and the circulation pump 4 feeds a developing agent stored in the fluid tank 306 into the vibration type film separator 3 through the conduit 12.

A developing agent fed into the fluid tank 306 is fed into the vibration type film separator 3 by means of the circulation pump 4. Similarly to the above-mentioned exemplary embodiment 1, impurities are removed out of the developing agent by means of the vibration type film separator 3.

The exemplary embodiment 2 in accordance with the present invention is designed to additionally include the centrifugal separator 301 which separates impurities out of a developing agent having been used for a wet step carried out in the wet-step bath 1. The vibration type film separator 3 further separates impurities out of a developing agent out of which impurities have been removed by means of the centrifugal separator 301. Thus, the exemplary embodiment 2 provides the same advantages as those of the above-mentioned exemplary embodiment 1, and further provides an advantage that it is possible to separate or remove solids out of a mixture solution of a used developing agent and a condensed developing agent exhausted from the vibration type film separator 3.

Exemplary Embodiment 3

The above-mentioned exemplary embodiment 1 is designed to include a single fluid tank 2. The exemplary embodiment 3 in accordance with the present invention is designed to include two fluid tanks 2, one of which is selected and used.

Figure 7:
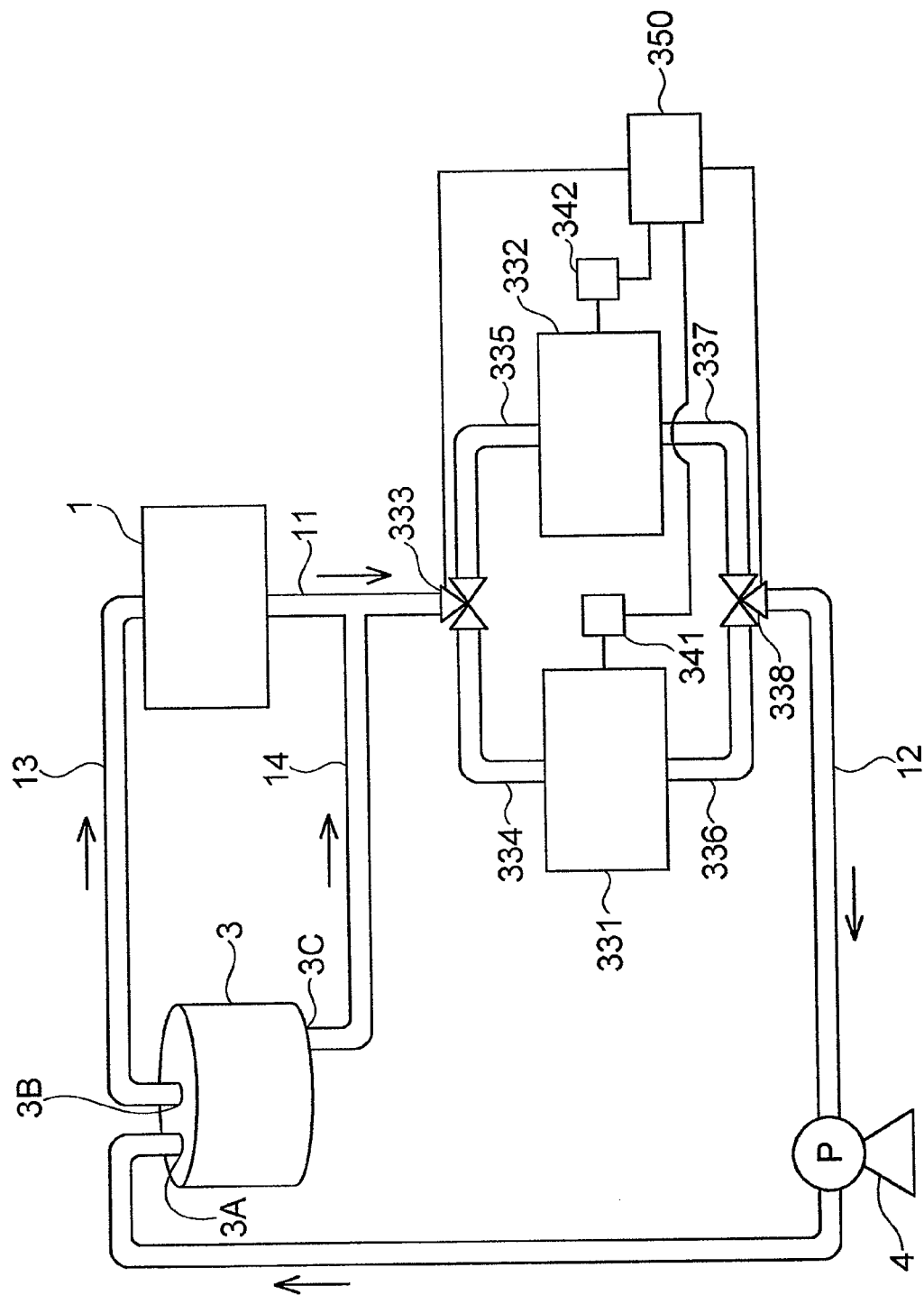
FIG. 7 is a schematic view illustrating a structure of a wet-processing apparatus in accordance with the third embodiment of the present invention.

FIG. 7 is a schematic view illustrating a structure of a circulation type wet-processing apparatus 300 in accordance with the exemplary embodiment 3 of the present invention.

The circulation type wet-processing apparatus 300 in accordance with the exemplary embodiment 3 is structurally different from the circulation type wet-processing apparatus 100 in accordance with the above-mentioned exemplary embodiment 1 only in the following, and has the same structure as that of the circulation type wet-processing apparatus 100 in accordance with the above-mentioned exemplary embodiment 1 except the following. Accordingly, parts of the circulation type wet-processing apparatus 300 in accordance with the exemplary embodiment 3 corresponding to those of the circulation type wet-processing apparatus 100 in accordance with the above-mentioned exemplary embodiment 1 have been provided with the same reference numerals, and are not explained.

As illustrated in FIG. 7, the circulation type wet-processing apparatus 300 in accordance with the exemplary embodiment 3 is designed to include, in addition to the wet-step bath 1, the vibration type film separator 3, the circulation pump 4, and the conduits 11, 12, 13 and 14, first and second fluid tanks 331 and 332 which are able to temporarily store a developing agent having been used for a wet step carried out in the wet-step bath 1, a conduit 334 through which the conduit 11 and the first fluid tank 331 make fluid communication with each other, a conduit 335 through which the conduit 11 and the second fluid tank 332 make fluid communication with each other, a first valve 333 through which a mixture solution (a mixture solution of a used developing agent and a condensed developing agent) fed through the conduit 11 is fed into a tank selected among the first and second fluid tanks 331 and 332, a conduit 336 through which the first fluid tank 331 and the conduit 12 make fluid communication with each other, a conduit 337 through which the second fluid tank 332 and the conduit 12 make fluid communication with each other, a second valve 338 through which the conduit 12 makes fluid communication with a tank selected among the first and second fluid tanks 331 and 332, a first concentration detecting sensor 341 which detects a concentration of impurities contained in a condensed developing agent stored in the first fluid tank 331, a second concentration detecting sensor 342 which detects a concentration of impurities contained in a condensed developing agent stored in the second fluid tank 332, and a controller 350 which operates the first and second valves 333 and 338 in accordance with the concentrations detected by the first and second concentration detecting sensors 341 and 342.

Each of the first and second valves 333 and 338 is comprised of an electrically driven three-way valve. The first valve 333 connects the conduit 11 to one of the conduit 334 and the conduit 335 under the control by the controller 350. The second valve 338 connects the conduit 12 to one of the conduit 336 and the conduit 337 under the control by the controller 350.

The controller 350 synchronously controls the first and second valves 333 and 338. Specifically, the conduit 336 is connected to the conduit 12 through the second valve 338 when the conduit 11 is connected to the conduit 334 through the first valve 333, whereas the conduit 337 is connected to the conduit 12 through the second valve 338 when the conduit 11 is connected to the conduit 335 through the first valve 333.

The controller 350 selects the first fluid tank 331 to be used, by connecting the conduit 11 to the conduit 334 through the first valve 333 and connecting the conduit 336 to the conduit 12 through the second valve 338, or selects the second fluid tank 332 to be used, by connecting the conduit 11 to the conduit 335 through the first valve 333 and connecting the conduit 337 to the conduit 12 through the second valve 338.

The controller 350, if a concentration of impurities contained in a developing agent stored in the selected tank exceeds a threshold concentration, switches the selected tank to another tank.

Specifically, assuming that the first fluid tank 331 is selected as a tank to be used, the controller 350 controls an operation of the first and second valves 333 and 338 to thereby switch the first fluid tank 331 to the second fluid tank 332 as a tank to be used, when a concentration detected by the first concentration detecting sensor 341 which detects a concentration of impurities contained in a developing agent stored in the first fluid tank 331 exceeds a threshold concentration.

In contrast, assuming that the second fluid tank 332 is selected as a tank to be used, the controller 350 controls an operation of the first and second valves 333 and 338 to thereby switch the second fluid tank 332 to the first fluid tank 331 as a tank to be used, when a concentration detected by the second concentration detecting sensor 342 which detects a concentration of impurities contained in a developing agent stored in the second fluid tank 332 exceeds a threshold concentration.

Among the above-mentioned structure, the first valve 333, the second valve 338, and the conduits 334, 335, 336 and 337 define a flow-path switching unit.

In the exemplary embodiment 3, the conduit 11 is connected to the first valve 333. The conduit 12 connects the second valve 338 to the outlet 3A of the vibration type film separator 3. The circulation pump 4 either feeds a developing agent stored in the first fluid tank 331 into the vibration type film separator 3 through the conduits 336 and the conduit 12, or feeds a developing agent stored in the second fluid tank 332 into the vibration type film separator 3 through the conduits 337 and the conduit 12.

Similarly to the above-mentioned exemplary embodiment 1, impurities are removed by means of the vibration type film separator 3 out of a developing agent fed into the vibration type film separator 3 by means of the circulation pump 4.

Hereinbelow is explained, among an operation of the circulation type wet-processing apparatus 300 in accordance with the exemplary embodiment 3, an operation for selecting one of the first fluid tank 331 and the second fluid tank 332.

For instance, it is assumed that the controller 350 initially selects the first fluid tank 331 as a tank to be used.

That is, the controller 350 connects the conduit 11 to the conduit 334 through the first valve 331, and further connects the conduit 336 to the conduit 12 through the second valve 338.

A used developing agent and a condensed developing agent are fed into the first fluid tank 331 among the first and second fluid tanks 331 and 332 from the wet-step bath 1 and the vibration type film separator 3, respectively, and further, a mixture solution stored in the first fluid tank 331 is fed into the vibration type film separator 3.

The first concentration detecting sensor 341 detects a concentration of impurities of the mixture solution stored in the first fluid tank 331, and transmits the detection result to the controller 350. If a concentration of impurities of the mixture solution stored in the first fluid tank 331 increases and exceeds a threshold concentration, the controller 350 controls an operation of the first and second valves 333 and 338.

Specifically, the controller 350 connects the conduit 11 to the conduit 335 through the first valve 333, and further connects the conduit 337 to the conduit 12 through the second valve 338, to thereby select the second fluid tank 332 as a tank to be used.

Thus, a used developing agent from the wet-step bath 1 and a condensed developing agent from the vibration type film separator 3 are fed selectively to the second fluid tank 332 among the first and second fluid tanks 331 and 332, and furthermore, a mixture solution stored in the second fluid tank 332 is fed into the vibration type film separator 3.

Solids (solidified impurities) are recovered out of the mixture solution (condensed developing agent) stored in the first fluid tank 331.

The second concentration detecting sensor 342 detects a concentration of impurities contained in the mixture solution stored in the second fluid tank 332, and transmits the detection results to the controller 350. If a concentration of impurities of the mixture solution stored in the second fluid tank 332 increases and exceeds a threshold concentration, the controller 350 controls an operation of the first and second valves 333 and 338.

Specifically, the controller 350 connects the conduit 11 to the conduit 334 through the first valve 333, and further connects the conduit 336 to the conduit 12 through the second valve 338, to thereby select the first fluid tank 331 as a tank to be used.

Thus, a used developing agent from the wet-step bath 1 and a condensed developing agent from the vibration type film separator 3 are fed selectively to the first fluid tank 332, and furthermore, a mixture solution stored in the first fluid tank 331 is fed into the vibration type film separator 3.

Solids (solidified impurities) are recovered out of the mixture solution (condensed developing agent) stored in the second fluid tank 332.

Thus, it is possible to continuously separate and recover impurities out of a used developing agent without stopping an operation of the circulation type wet-processing apparatus 300.

In accordance with the above-mentioned exemplary embodiment 3, the wet-processing apparatus includes a plurality of the fluid tanks 331 and 332. A used developing agent from the wet-step bath 1 and a condensed developing agent from the vibration type film separator 3 are fed selectively to one of the fluid tanks 331 and 332. Since the wet-processing apparatus includes a flow-path switching unit (the first valve 333, the second valve 338, and the conduits 334, 335, 336 and 337) through which a mixture solution stored in the selected tank is fed into the vibration type film separator 3, the exemplary embodiment 3 provides the same advantages as those provided by the above-mentioned exemplary embodiment 1, and further provides an advantage that it is possible to continuously separate and recover impurities out of a used developing agent without stopping an operation of the circulation type wet-processing apparatus 300.

Furthermore, since the circulation type wet-processing apparatus 300 includes the concentration detecting sensors 341 and 342 which detect a concentration of impurities contained in a mixture solution stored in the fluid tanks 331 and 332, respectively, and the controller 350 which operates the flow-path switching unit (in particular, the first and second valves 333 and 338) to thereby switch the currently selected tank to the other tank, if a concentration of impurities contained in a mixture solution stored in the selected tank exceeds a predetermined threshold concentration, it is possible to automatically switch the fluid tanks 331 and 332 to each other.

It is possible to design the above-mentioned exemplary embodiment 2 to include a plurality of fluid tanks 2 similarly to the exemplary embodiment 3, in which case, one of a plurality of the fluid tanks 2 is selected for use.

Furthermore, it is possible to design the above-mentioned exemplary embodiment 2 to include a plurality of fluid tanks 306 similarly to the exemplary embodiment 3, in which case, one of a plurality of the fluid tanks 306 is selected for use.

Exemplary Embodiment 4

A wet-processing apparatus in accordance with the exemplary embodiment 4 of the present invention is designed to include a plurality of (for instance, two) vibration type film separators.

Figure 8:
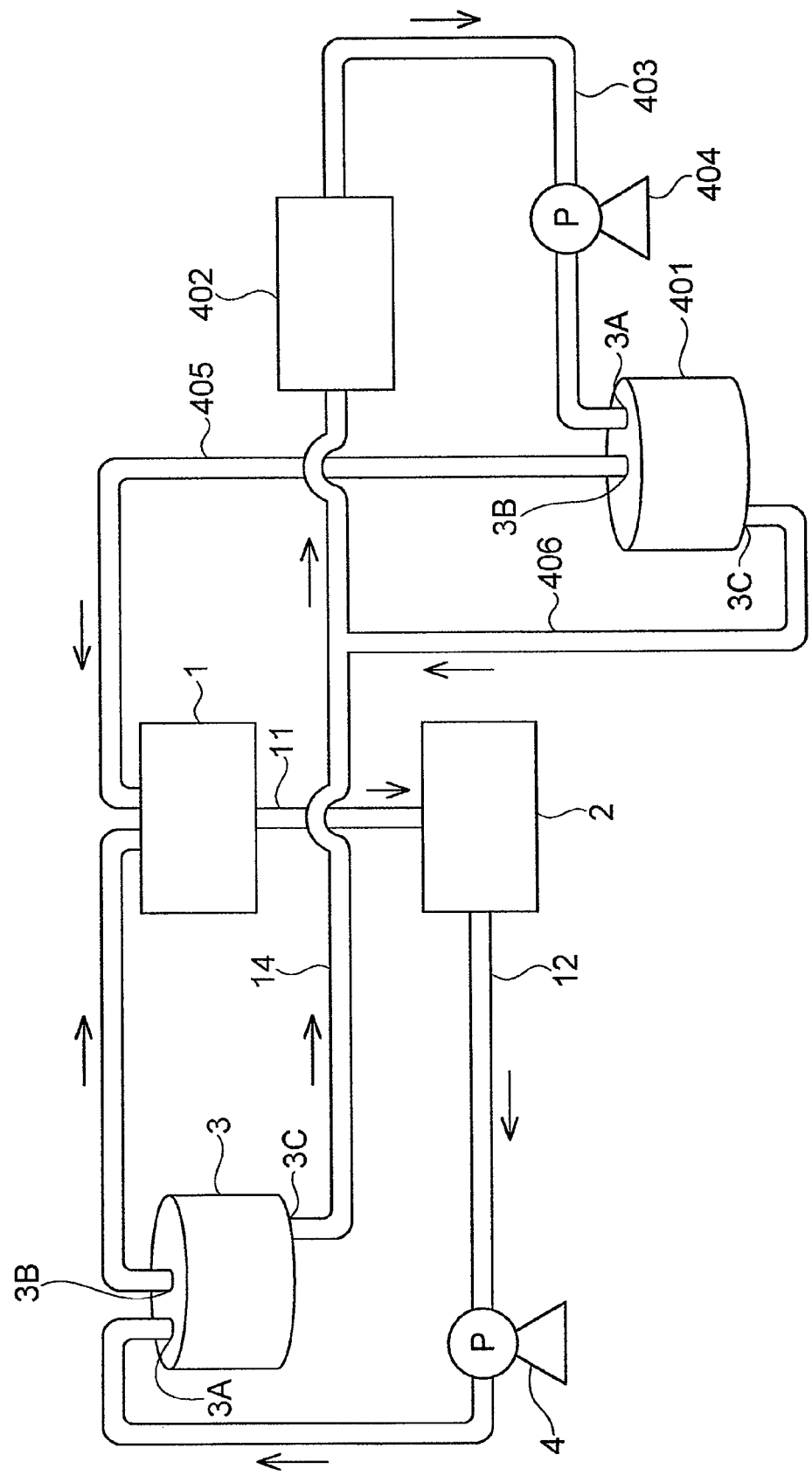
FIG. 8 is a schematic view illustrating a structure of a wet-processing apparatus in accordance with the fourth embodiment of the present invention.

FIG. 8 is a schematic view illustrating a structure of a circulation type wet-processing apparatus 400 in accordance with the exemplary embodiment 4 of the present invention.

The circulation type wet-processing apparatus 400 in accordance with the exemplary embodiment 4 is structurally different from the circulation type wet-processing apparatus 100 in accordance with the above-mentioned exemplary embodiment 1 only in the following, and has the same structure as that of the circulation type wet-processing apparatus 100 in accordance with the above-mentioned exemplary embodiment 1 except the following. Accordingly, parts of the circulation type wet-processing apparatus 400 in accordance with the exemplary embodiment 4 corresponding to those of the circulation type wet-processing apparatus 100 in accordance with the above-mentioned exemplary embodiment 1 have been provided with the same reference numerals, and are not explained.

As illustrated in FIG. 8, the circulation type wet-processing apparatus 400 in accordance with the exemplary embodiment 4 includes, in addition to the parts of the circulation type wet-processing apparatus 100 in accordance with the exemplary embodiment 1, a second fluid tank 402 which temporarily stores a condensed developing agent containing impurities having been separated out of a developing agent by means of the vibration type film separator 3, and a second vibration type film separator 401 which further separates impurities out of a condensed developing agent fed from the second fluid tank 402.

The second vibration type film separator 401 has the same structure as that of the vibration type film separator 3.

The circulation type wet-processing apparatus 400 in accordance with the exemplary embodiment 4 further includes a conduit 403 through which a condensed developing agent stored in the second fluid tank 402 to an inlet 3A of the second vibration type film separator 401, a pump 404 arranged in the conduit 403 for feeding a condensed developing agent stored in the second fluid tank 402 to the inlet 3A of the second vibration type film separator 401 through the conduit 403, a conduit 405 through which a first outlet 3B of the second vibration type film separator 401 and the wet-step bath 1 make fluid communication to each other, and a conduit 406 through which a second outlet 3C of the second vibration type film separator 401 and the conduit 14 make fluid communication to each other.

In the exemplary embodiment 4, the conduit 14 makes fluid communication not to the conduit 11, but to the second fluid tank 402.

Since the circulation type wet-processing apparatus 400 in accordance with the exemplary embodiment 4 further includes the second fluid tank 402 which temporarily stores a condensed developing agent containing impurities having been separated out of a developing agent by means of the vibration type film separator 3, and the second vibration type film separator 401 which further separates impurities out of a condensed developing agent fed from the second fluid tank 402, the circulation type wet-processing apparatus 400 provides the same advantages as those provided by the exemplary embodiment 1, and further provides an advantage that it is possible to reduce a frequency at which the filters 31 of the vibration type film separator 3 are exchanged to new ones, relative to the same in the exemplary embodiment 1.

Specifically, in the exemplary embodiment 4, a condensed developing agent separated out of a developing agent by means of the vibration type film separator 3 is not returned to the fluid tank 2, but supplied to the second fluid tank 402. Hence, it is possible to suppress increase in a concentration of impurities contained in a developing agent stored in the fluid tank 2, and reduce a frequency at which the filters 31 of the vibration type film separator 3 are exchanged to new ones.

The circulation type wet-processing apparatus 400 in accordance with the exemplary embodiment 4 may be designed to include a plurality of the second fluid tanks 402, similarly to the above-mentioned exemplary embodiment 3, in which case, one of the second fluid tanks 402 is selected for use.

The circulation type wet-processing apparatus 400 in accordance with the exemplary embodiment 4 may be designed to divide a condensed developing agent fed from the second fluid tank 402, into a developing agent and solids by means of the centrifugal separator 301, similarly to the above-mentioned exemplary embodiment 2.

In the above-mentioned exemplary embodiments, though a developing agent is exemplified as a solution to be processed, a solution to be processed is not to be limited to a developing agent.

In the above-mentioned exemplary embodiments, though a substrate defining PDP is exemplified as a substrate to which a wet step is applied by means of the circulation type wet-processing apparatus. A substrate to which a wet step is applied by means of the circulation type wet-processing apparatus is not to be limited to a PDP substrate. For instance, a wet step to be carried out by means of the circulation type wet-processing apparatus may be applied to any display panels including a liquid crystal display panel.

A structure of the vibration type film separator 3 is not to be limited to the above-mentioned structure, but may be varied. Hereinbelow are explained variants of the vibration type film separator 3.

(First Variant)

Figure 9:
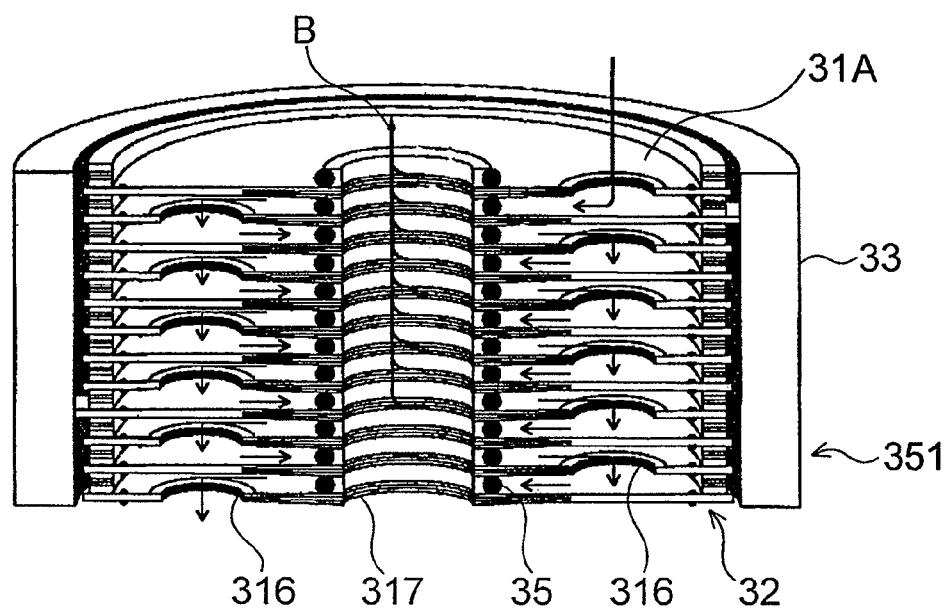
FIG. 9 is a perspective cross-sectional view illustrating a gist of a vibration type film separator in accordance with a first variant.
Figure 10:
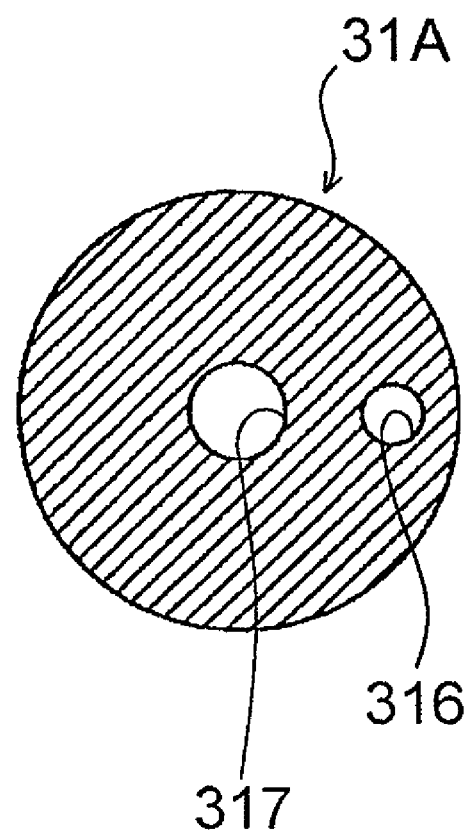
FIG. 10 is a plan view of a filter of the vibration type film separator in accordance with a first variant.

FIG. 9 is a perspective cross-sectional view illustrating a gist of a vibration type film separator 351 in accordance with a first variant of the vibration type film separator 3, and FIG. 10 is a plan view of a filter 31A of the vibration type film separator 351 in accordance with the first variant.

In the above-mentioned vibration type film separator 3 (FIG. 2), a used developing agent passing through the first opening 316 along the path A may not penetrate the filters 31 disposed at a relatively upper position, but may penetrate the filters 31 disposed at a relatively lower position. As a result, the filters 31 disposed at a relatively upper position may not be used for filtration.

Thus, each of the filters 31A of the vibration type film separator 351 in accordance with the first variant is designed not to include a third opening 318, in comparison with the filters 31 (FIG. 4) of the above-mentioned vibration type film separator 3. Specifically, as illustrated in FIG. 10, each of the filters 31A of the vibration type film separator 351 in accordance with the first variant includes only a first opening 316 and a second opening 317.

As illustrated in FIG. 9, the first openings 316 of the filters 31A disposed vertically adjacent to each other are disposed symmetrically with each other about the second opening 317 in the filter unit 32. Thus, a used developing agent uniformly penetrates each of the filters 31A (and accordingly, a used developing agent is uniformly filtered in each of the filters 31A), ensuring that each of the filters 31A can be effectively utilized.

Though the first openings 316 of the filters 31A disposed vertically adjacent to each other are illustrated in FIG. 9 to be disposed symmetrically with each other about the second opening 317, as long as the first openings 316 in the filters 31A are not in alignment with each other, it is not always necessary to arrange the first openings 316 to be symmetrical with each other about the second opening 317.

(Second Variant)

Figure 11:
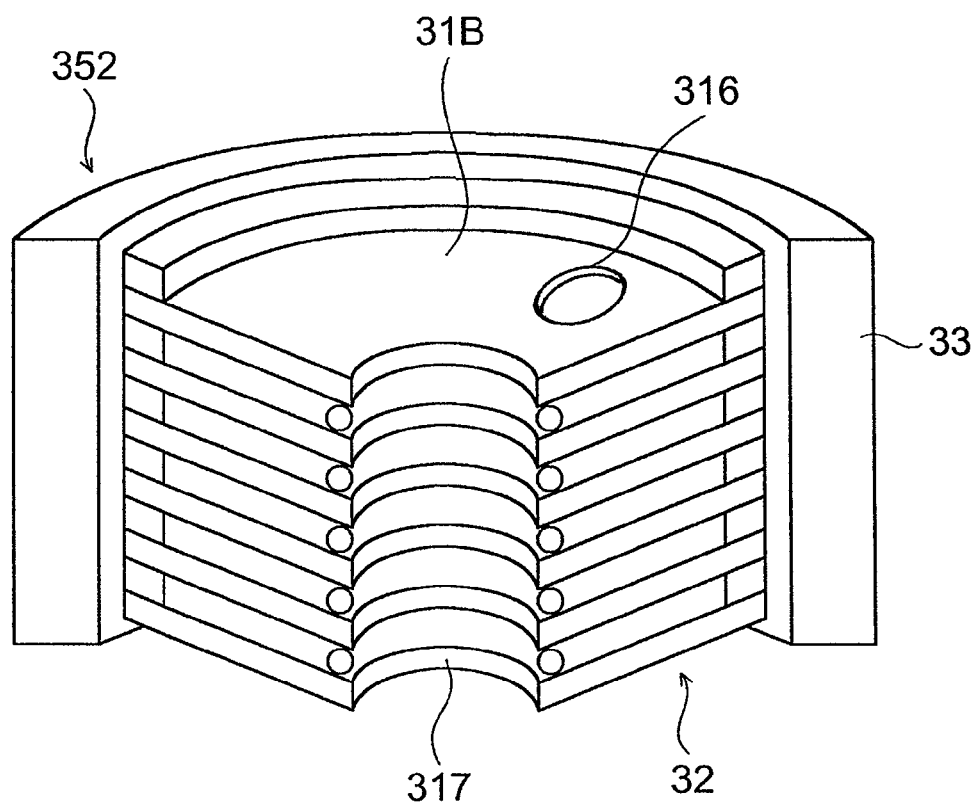
FIG. 11 is a perspective cross-sectional view illustrating a gist of a vibration type film separator in accordance with a second variant.
Figure 12:
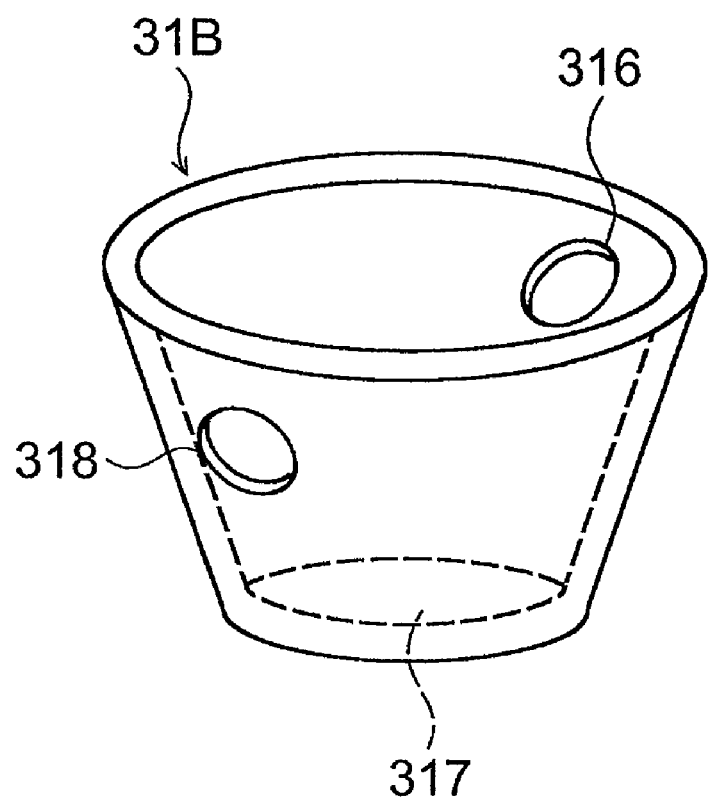
FIG. 12 is a perspective view of a filter of the vibration type film separator in accordance with a second variant.

FIG. 11 is a perspective cross-sectional view illustrating a gist of a vibration type film separator 352 in accordance with a second variant of the vibration type film separator 3, and FIG. 12 is a perspective view of a filter 31B of the vibration type film separator 352 in accordance with the second variant.

The vibration type film separator 352 in accordance with the second variant is structurally different from the vibration type film separator 3 in using reverse-conical filters 31B in place of the filters 31 which are in the form of a flat plate, and is the same in structure as that of the vibration type film separator 3 except that.

As illustrated in FIG. 12, the vibration type film separator 352 in accordance with the second variant includes the reverse-conical filters 31B in place of the flat-shaped filters 31.

Since a sidewall of each of the filters 31B is inclined, a gravity force applies to a used developing agent passing along the path A and entering each of the filters 31B through the first opening 316. Accordingly, in comparison with the flat-shaped filters 31, a velocity at which a developing agent out of which impurities are removed flows towards the second opening 317 in the drain cloth 314 is increased by a degree applied by a gravity force.

Accordingly, the vibration type film separator 352 in accordance with the second variant makes it possible to a velocity at which impurities are removed out of a used developing agent, that is, a filtration rate.

Similarly to the vibration type film separator 351 in accordance with the first variant, each of the filters 31B may be designed to include the first opening 316 and the second opening 317, but not include the third opening 318.

(Third Variant)

Figure 13:
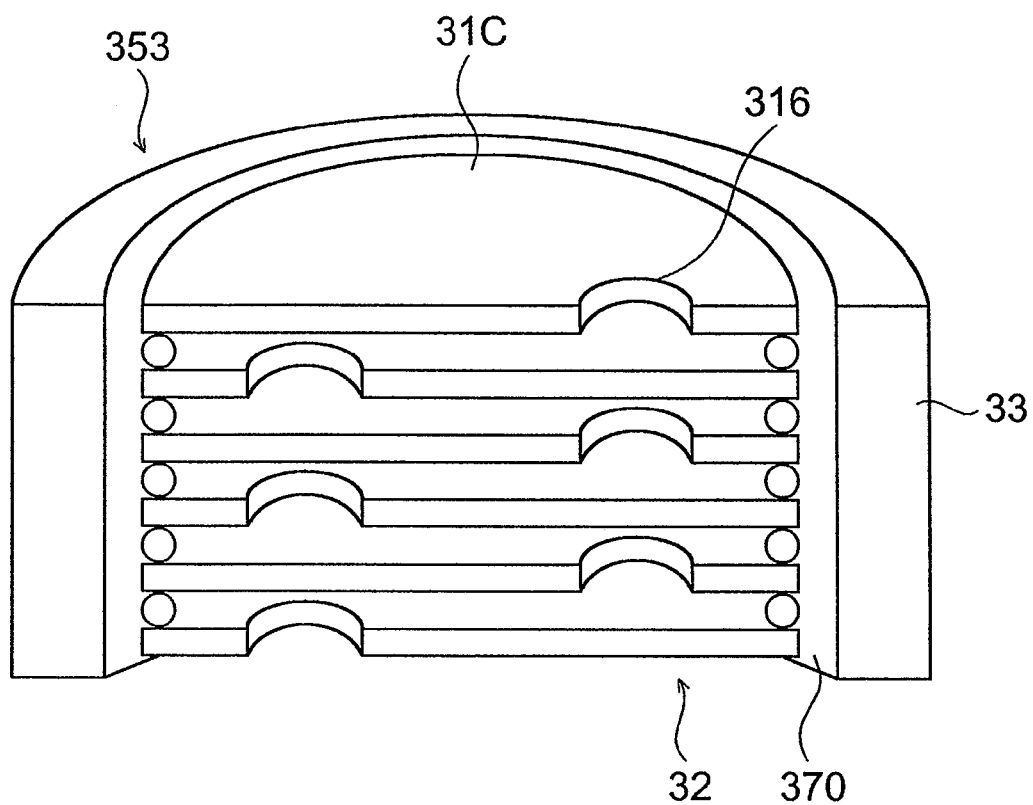
FIG. 13 is a perspective cross-sectional view illustrating a gist of a vibration type film separator in accordance with a third variant.
Figure 14:
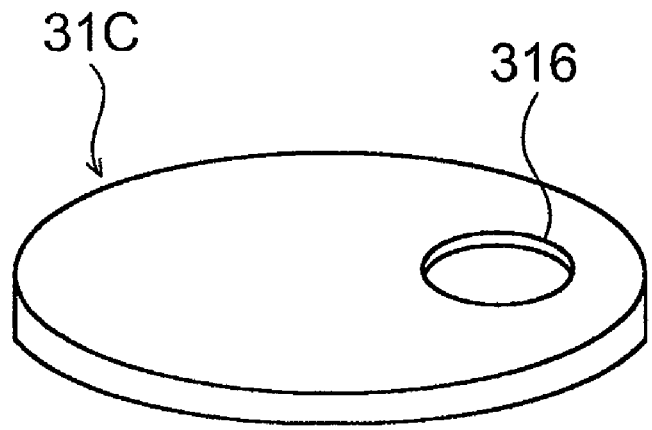
FIG. 14 is a perspective view of a filter of the vibration type film separator in accordance with a third variant.

FIG. 13 is a perspective cross-sectional view illustrating a gist of a vibration type film separator 353 in accordance with a third variant of the vibration type film separator 3, and FIG. 14 is a perspective view of a filter 31C of the vibration type film separator 353 in accordance with the third variant.

Each of the filters 31C used in the vibration type film separator 353 in accordance with the third variant is in the form of a circular flat plate. Each of the filters 31C is formed only with a first opening 316, as illustrated in FIG. 14.

Whereas the filters 31 are hermetically sealed with one another by means of the O-ring 35 acting as sealing material disposed along an edge of the second opening 317 in the vibration type film separator 3, an O-ring 35A acting as sealing material is disposed along an outer edge of each of the filters 31C in the vibration type film separator 353 in accordance with the third variant, as illustrated in FIG. 13.

Furthermore, the first openings 316 are arranged so as not to align with one another in the filters 31C vertically disposed adjacent to each other.

A developing agent out of which impurities were removed passes through the drain cloth 314, and drops to a space 370 formed between the filter unit 32 and the filter container 33. A developing agent accumulated in the space 370 is pumped up by means of a pump and so on, and is fed to the wet-step bath 1 through the first outlet 3B and the conduit 13.

In the vibration type film separator 3, each of the filters 31 has a reduced area due to the formation of the second opening 317, and hence, a filtration efficiency at which impurities are filtrated is reduced. In contrast, since the vibration type film separator 353 in accordance with the third variant is not necessary to include the second opening 317, it is possible for each of the filters 31C to have a larger area than an area of the filters 31 of the vibration type film separator 3, ensuring it possible to enhance a filtration efficiency at which impurities are filtrated, in comparison with the vibration type film separator 3.

Each of the filters 31C in the vibration type film separator 353 in accordance with the third variant may be designed to include not only the first opening 316, but also the third opening 318.

(Fourth Variant)

Figure 15:
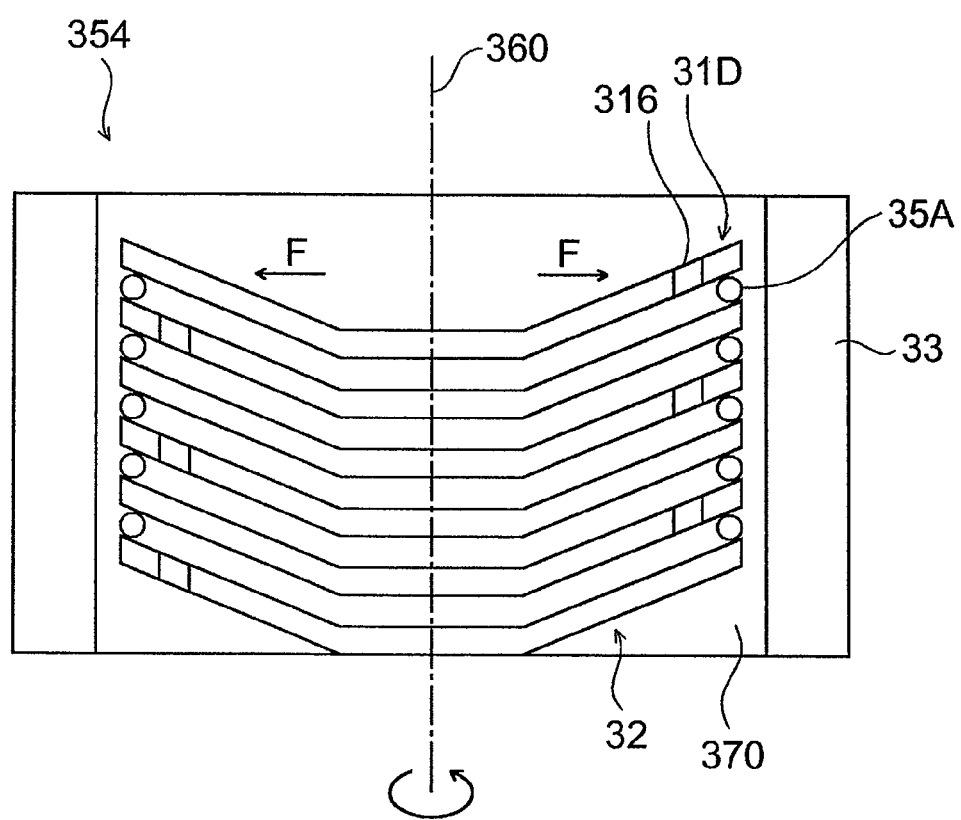
FIG. 15 is a perspective cross-sectional view illustrating a gist of a vibration type film separator in accordance with a fourth variant.
Figure 16:
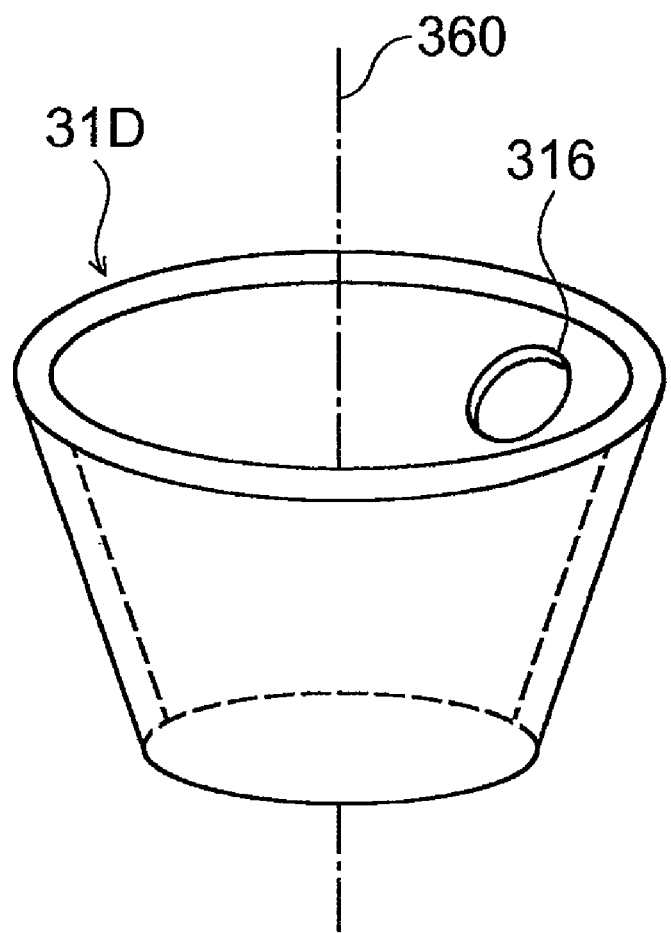
FIG. 16 is a perspective view of a filter of the vibration type film separator in accordance with a third variant.

FIG. 15 is a longitudinal cross-sectional view illustrating a gist of a vibration type film separator 354 in accordance with a fourth variant of the vibration type film separator 3, and FIG. 16 is a perspective view of a filter 31D of the vibration type film separator 354 in accordance with the fourth variant.

As illustrated in FIG. 16, the vibration type film separator 354 in accordance with the fourth variant includes reverse-conical filters 31D. Each of the filters 31D is formed with a first opening 316.

In the vibration type film separator 354 in accordance with the fourth variant, as illustrated in FIG. 15, an O-ring 35A acting as a seal is arranged along an outer edge of each of the filters 31D, similarly to the vibration type film separator 353 in accordance with the third variant.

Furthermore, the first openings 316 in the filters 31D disposed vertically adjacent to each other are arranged not to be in alignment with each other.

The vibration type film separator 354 in accordance with the fourth variant is designed to include, in addition to the vibrator equipped in the vibration type film separator 3, a rotation unit for rotating the filters 31D (that is, the filter unit 32). The rotation unit rotates each of the filters 31D about a center axis 360 thereof.

A developing agent out of which impurities were removed passes through the drain cloth 314, and drops to a space 370 formed between the filter unit 32 and the filter container 33. A developing agent accumulated in the space 370 is pumped up by means of a pump and so on, and is fed to the wet-step bath 1 through the first outlet 3B and the conduit 13.

In the vibration type film separator 354 in accordance with the fourth variant, each of the filters 31D rotates about the center axis 360 thereof. A centrifugal force F acts on a used developing agent passing through the path A and entering each of the filters 31D through the first opening 316. A used developing agent is compressed onto a sidewall of each of the filters 31D due to the centrifugal force F, ensuring that a rate at which a developing agent is absorbed into the drain cloth 314 through the fluid-permeable films 311 and 312 is increased, and hence, a filtration rate at which impurities are removed out of a used developing agent can be enhanced. Thus, it is possible to enhance a filtration efficiency for removing impurities relative to the vibration type film separator 3.

Each of the filters 31D in the vibration type film separator 354 in accordance with the fourth variant may be formed with not only the first opening 316, but also the third opening 318.

Not only the vibration type film separator 3, but also the second vibration type film separator 401 may be substituted for any one of the vibration type film separators 351, 352, 353 and 354 in accordance with the above-mentioned first to fourth variants.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2005-157182 filed on May 30, 2005 including specification, claims, drawings and summary is incorporated herein by reference in its entirety.

The invention claimed is:

1. A wet-processing apparatus for carrying out a wet-step to form a pattern on a substrate defining a display panel, comprising:
    a wet-step bath in which said wet-step is carried out;
    a vibration-type film separator for separating impurities out of a solution used in said wet-step;
    a re-supply path through which said solution out of which said impurities were removed by means of said vibration-type film separator is re-supplied to said wet-step bath;
    a plurality of tanks in each of which a solution having been used for said wet-step and supplied from said wet-step bath is temporarily stored;
    a pump for feeding said solution stored in said tanks into said vibration-type film separator; and
    a path through which an enriched solution containing impurities separated from said solution by means of said vibration-type film separator is fed into said tanks from said vibration-type film separator, said solution and said enriched solution being supplied from said wet-step bath and said vibration-type film separator, respectively, selectively to one of said tanks;
    a flow-path switching unit for supplying the solution stored in the one selected tank into said vibration-type film separator;
    a concentration-detecting sensor for detecting a concentration of impurities contained in said solution stored in each of said tanks; and
    a controller which, when said concentration of impurities contained in the solution stored in the one selected tank is over a threshold, controls said flow-path switching unit to switch from supplying the solution of the one selected tank into said vibration-type film separator to supplying the solution of another one of the tanks into the vibration-type film separator.

2. The wet-processing apparatus as set forth in claim 1, further comprising a centrifugal separator which separates impurities out of a solution used for said wet-step carried out in said wet-step bath,
    and wherein said vibration-type film separator further separates impurities out of said solution out of which impurities have been already separated by said centrifugal separator.

3. The wet-processing apparatus as set forth in claim 2, further comprising:
    a first tank temporarily storing therein a solution having been used for said wet-step, supplied from said wet-step bath;
    a first pump for feeding said solution stored in said first tank, into said centrifugal separator;
    a second tank temporarily storing a solution out of which said impurities have been separated by said centrifugal separator; and
    a second pump for feeding said solution stored in said second tank, into said vibration-type film separator.

4. The wet-processing apparatus as set forth in claim 3, further comprising a path through which a enriched solution containing impurities having been separated out of a solution by said vibration-type film separator is fed into said first tank from said vibration-type film separator.

5. The wet-processing apparatus as set forth in claim 1, further comprising:
a second tank temporarily storing a enriched solution containing impurities having been separated out of a solution by said vibration-type film separator; and
a second vibration-type film separator which further separates impurities out of said enriched solution supplied from said second tank.

6. The wet-processing apparatus as set forth in claim 5, further comprising a path through which an enriched solution containing impurities separated from said solution by means of said second vibration-type film separator is fed into said second tank from said second vibration-type film separator.

7. The wet-processing apparatus as set forth in claim 5, further comprising a re-supply path through which a solution separated out of said enriched solution by means of said second vibration-type film separator is re-supplied to said wet-step bath from said second vibration-type film separator.

8. The wet-processing apparatus as set forth in claim 5, wherein at least one of said vibration-type film separator and said second vibration-type film separator is comprised of:
a plurality of filters vertically arranged such that each of said filters is spaced away by a predetermined gap from adjacent ones;
a filter container in which said filters are accumulated; and
a vibrator for vibrating both said filters and said filter container,
wherein each of said filters is comprised of a metal plate, a film which allows said solution to pass therethrough, but does not allow said impurities to pass therethrough, and a drain cloth sandwiched between said metal plate and said film, and allowing said solution to pass therethrough,
each of said filters is in the form of a flat plate, and is formed with a first opening and a second opening,
a seal is formed along and between edges of said second openings of filters disposed vertically adjacent to each other, and
said first openings of said filters vertically adjacent to each other are arranged in non-alignment with each other.

9. The wet-processing apparatus as set forth in claim 5, wherein at least one of said vibration-type film separator and said second vibration-type film separator is comprised of:
a plurality of filters vertically arranged such that each of said filters is spaced away by a predetermined gap from adjacent ones;
a filter container in which said filters are accumulated; and
a vibrator for vibrating both said filters and said filter container,
wherein each of said filters is comprised of a metal plate, a film which allows said solution to pass therethrough, but does not allow said impurities to pass therethrough, and a drain cloth sandwiched between said metal plate and said film, and allowing said solution to pass therethrough,
each of said filters is in the form of a reversed cone, and is formed with a first opening and a second opening, and
a seal is formed along and between edges of said second openings of filters disposed vertically adjacent to each other.

10. The wet-processing apparatus as set forth in claim 5, wherein at least one of said vibration-type film separator and said second vibration-type film separator is comprised of:
a plurality of filters vertically arranged such that each of said filters is spaced away by a predetermined gap from adjacent ones;
a filter container in which said filters are accumulated; and
a vibrator for vibrating both said filters and said filter container,
wherein each of said filters is comprised of a metal plate, a film which allows said solution to pass therethrough, but does not allow said impurities to pass therethrough, and a drain cloth sandwiched between said metal plate and said film, and allowing said solution to pass therethrough,
each of said filters is in the form of a flat plate, and is formed with a first opening,
a seal is formed along and between outer edges of filters disposed vertically adjacent to each other, and
said first openings of said filters vertically adjacent to each other are arranged in non-alignment with each other.

11. The wet-processing apparatus as set forth in claim 5, wherein at least one of said vibration-type film separator and said second vibration-type film separator is comprised of:
a plurality of filters vertically arranged such that each of said filters is spaced away by a predetermined gap from adjacent ones;
a filter container in which said filters are accumulated; and
a rotation unit for rotating said filters,
wherein each of said filters is comprised of a metal plate, a film which allows said solution to pass therethrough, but does not allow said impurities to pass therethrough, and a drain cloth sandwiched between said metal plate and said film, and allowing said solution to pass therethrough,
each of said filters is in the form of a reversed cone, and is formed with a first opening,
a seal is formed along and between outer edges of filters disposed vertically adjacent to each other,
said first openings of said filters vertically adjacent to each other are arranged in non-alignment with each other, and
said rotation unit rotates said filters around central axes of said filters.

12. A method of fabricating a display panel including a wet-step to form a pattern on a substrate defining a display panel, comprising:
a separation step of separating impurities out of a solution having been used in said wet-step carried out in a wet-step bath, said separation step being carried out by means of a vibration-type film separator;
re-supplying a solution out of which said impurities were removed in said separation step, into said wet-step bath;
storing an enriched solution containing said impurities separated out of said solution by means of said vibration-type film separator, into a tank selected among a plurality of tanks which are capable of storing said enriched solution;
detecting a concentration of impurities contained in said enriched solution stored in the selected tank; and
switching the selected tank into another tank, when said concentration of impurities contained in said enriched solution stored in the selected tank is over a threshold.

13. The method as set forth in claim 12, wherein a step of forming said pattern is comprised of a step of forming at least one of an electrode, a rib, a fluorophor layer, a black matrix, a black stripe, and a color filter.

* * * * *